(12) United States Patent
Noonan et al.

(10) Patent No.: US 10,709,019 B1
(45) Date of Patent: Jul. 7, 2020

(54) PRINTED CIRCUIT BOARD CONNECTION FOR INTEGRATED CIRCUITS USING TWO ROUTING LAYERS

(71) Applicant: Google LLC, Mountain View, CA (US)

(72) Inventors: Andrew Gerard Noonan, Campbell, CA (US); Sara Zebian, Los Gatos, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 16/800,701

(22) Filed: Feb. 25, 2020

Related U.S. Application Data

(63) Continuation of application No. 16/528,244, filed on Jul. 31, 2019, now Pat. No. 10,617,009.

(51) Int. Cl.
| | |
|---|---|
| *H05K 1/00* | (2006.01) |
| *H05K 1/18* | (2006.01) |
| *H05K 1/11* | (2006.01) |
| *H05K 3/06* | (2006.01) |
| *H05K 3/40* | (2006.01) |
| *H05K 3/00* | (2006.01) |
| *H05K 3/34* | (2006.01) |
| *H05K 1/02* | (2006.01) |

(52) U.S. Cl.
CPC ............. *H05K 1/181* (2013.01); *H05K 1/115* (2013.01); *H05K 3/0005* (2013.01); *H05K 3/06* (2013.01); *H05K 3/341* (2013.01); *H05K 3/4038* (2013.01); *H05K 1/0228* (2013.01); *H05K 2201/09227* (2013.01); *H05K 2201/10522* (2013.01)

(58) Field of Classification Search
CPC ...... H05K 1/181; H05K 1/115; H05K 3/0005; H05K 3/06; H05K 3/341; H05K 3/4038; H05K 2201/09227; H05K 2201/10522
See application file for complete search history.

(56) References Cited

U.S. PATENT DOCUMENTS

| | | | |
|---|---|---|---|
| 6,418,552 B1 | 7/2002 | Osborn | |
| 6,930,888 B2 * | 8/2005 | Miller | H05K 1/0228 174/261 |
| 7,440,449 B2 | 10/2008 | Carson et al. | |
| 7,626,216 B2 | 12/2009 | McKinzie, III | |
| 7,631,133 B2 | 12/2009 | Fallah-Adl et al. | |
| 7,725,860 B1 | 5/2010 | Kwong et al. | |
| 8,633,399 B2 | 1/2014 | Kagaya | |
| 8,819,616 B2 | 8/2014 | Philip et al. | |
| 9,750,135 B2 | 8/2017 | Pipkin et al. | |

(Continued)

*Primary Examiner* — Pete T Lee
(74) *Attorney, Agent, or Firm* — Fish & Richardson P.C.

(57) ABSTRACT

Methods, systems, and apparatus, including printed circuit boards (PCBs) with trace routing topologies are disclosed. In one aspect, a PCB includes an external layer that includes multiple integrated circuit (IC) installation regions that are each configured to receive an IC, a first trace routing layer having a first conductive trace that is routed along a first path from a first IC installation region to a second IC installation region, a second trace routing layer having a second conductive trace that is routed along a second path from the first IC installation region to the second IC installation region, a first via region having one or more first vias that extend from the first trace routing layer to the second trace routing layer, and a second via region having one or more second vias that extend from the first trace routing layer to the second trace routing layer.

20 Claims, 5 Drawing Sheets

(56) References Cited

U.S. PATENT DOCUMENTS

| | | |
|---|---|---|
| 2006/0255460 A1 | 11/2006 | Memis |
| 2008/0093726 A1* | 4/2008 | Preda .................... H01L 23/50 |
| | | 257/700 |
| 2013/0069252 A1* | 3/2013 | Han .................... H01L 31/1876 |
| | | 257/787 |
| 2013/0161084 A1 | 6/2013 | Hayashi |
| 2015/0201500 A1 | 7/2015 | Shinar et al. |

* cited by examiner

PRINTED CIRCUIT BOARD CONNECTION FOR INTEGRATED CIRCUITS USING TWO ROUTING LAYERS

CROSS-REFERENCE TO RELATED APPLICATIONS

This application is a continuation application of, and claims priority to, U.S. patent application Ser. No. 16/528,244, titled "PRINTED CIRCUIT BOARD CONNECTION FOR INTEGRATED CIRCUITS USING TWO ROUTING LAYERS," filed on Jul. 31, 2019. The disclosure of the foregoing application is incorporated herein by reference in its entirety for all purposes.

BACKGROUND

Printed circuit boards (PCBs) are used in various electronic components. A PCB can include multiple routing layers on which conductive traces are used to connect components installed on the PCB. For example, multiple routing layers can be used to route signals between integrated circuits (ICs) installed on the PCB.

A full mesh topology of ICs is one in which each IC is connected to each other IC, e.g., for redundancy. A partial mesh topology of ICs is one in which some ICs are connected to multiple other ICs, but some ICs are not. To connect four or more ICs in a mesh topology, conductive traces will need to cross one another on different layers.

SUMMARY

This specification describes technologies relating to trace routing topologies for PCBs. In general, one innovative aspect of the subject matter described in this specification can be embodied in a printed circuit board including an external layer that includes multiple integrated circuit (IC) installation regions that are each configured to receive an IC; a first trace routing layer including a first conductive trace that is routed along a first path from a first IC installation region to a second IC installation region; a second trace routing layer including a second conductive trace that is routed along a second path from the first IC installation region to the second IC installation region, wherein the first path crosses the second path at a point between the first IC installation region and the second IC installation region; a first via region including one or more first vias that extend from the first trace routing layer to the second trace routing layer, the first via region being within a first perimeter defined by a first portion of the first path, a first portion of the second path, the point at which the first path crosses the second path, and a portion of a perimeter of the first IC installation region; and a second via region including one or more second vias that extend from the first trace routing layer to the second trace routing layer, the second via region being within a second perimeter defined by a second portion of the first path, a second portion of the second path, the point at which the first path crosses the second path, and a portion of a perimeter of the second IC installation region.

These and other implementations can each optionally include one or more of the following features. In some aspects, each first via electrically couples a respective third conductive trace on the first trace routing layer to a respective fourth conductive trace on the second trace routing layer. The respective third conductive trace, the respective fourth conductive trace, and the first via provide a first conductive path between a third IC installation region and a fourth IC installation region. In some aspects, each second via electrically couples a respective fifth conductive trace on the first trace routing layer to a respective sixth conductive trace on the second trace routing layer, wherein the respective fifth conductive trace, the respective sixth conductive trace, and the second via provide a second conductive path between the third IC installation region and the fourth IC installation region.

In some aspects, the first IC installation region is located in a first corner of a rectangular area. The second IC installation region can be located in a second corner of the rectangular area opposite the first corner. The third IC installation region can be located in a third corner of the rectangular area different from the first and second corners. The fourth IC installation region is located in a fourth corner of the rectangular area opposite the third corner.

Some aspects include a first IC installed at the first IC installation region, a second IC installed at the second IC installation region, a third IC installed at the third IC installation region, and a fourth IC installed at the fourth IC installation region. The first conductive trace electrically couples an input port of the first IC to an output port of the second IC. The second conductive trace electrically couples an output port of the first IC to an input port of the second IC. The first conductive path electrically couples an input port of the third IC to an output port of the fourth IC. The second conductive path electrically couples an output port of the third IC to an input port of the fourth IC. The first IC, the second IC, the third IC, and the fourth IC can be connected in a full mesh topology using only two trace routing layers of the printed circuit board. The external layer can include at least four ICs.

In general, another aspect of the subject matter described in this specification can be embodied in a printed circuit board including an external layer that includes multiple ICs installed thereon; a first trace routing layer including a first conductive trace that is routed along a first path from a first IC to a second IC; a second trace routing layer including a second conductive trace that is routed along a second path from the first IC to the second IC, wherein the first path crosses the second path at a point between the first IC and the second IC; a first via region including one or more first vias between the first trace routing layer and the second trace routing layer, the first via region being within a first perimeter defined by a first portion of the first path, a first portion of the second path, the point at which the first path crosses the second path, and a portion of a perimeter of the first IC; and a second via region including one or more second vias between the first trace routing layer and the second trace routing layer, the second via region including a second perimeter defined by a second portion of the first path, a second portion of the second path, the point at which the first path crosses the second path, and a portion of a perimeter of the second IC.

These and other implementations can each optionally include one or more of the following features. In some aspects, each first via electrically couples a respective third conductive trace on the first trace routing layer to a respective fourth conductive trace on the second trace routing layer. The respective third conductive trace, the respective fourth conductive trace, and the first via provide a first conductive path between a third IC and a fourth IC.

In some aspects, each second via electrically couples a respective fifth conductive trace on the first trace routing layer to a respective sixth conductive trace on the second trace routing layer. The respective fifth conductive trace, the respective sixth conductive trace, and the second via provide a second conductive path between the third IC and the fourth IC.

In some aspects, the first IC is located in a first corner of a rectangular area; the second IC is located in a second corner of the rectangular area opposite the first corner; the third IC is located in a third corner of the rectangular area different from the first and second corners; and the fourth IC is located in a fourth corner of the rectangular area opposite the third corner.

In some aspects, the first conductive trace electrically couples an input port of the first IC to an output port of the second IC; the second conductive trace electrically couples an output port of the first IC to an input port of the second IC; the first conductive path electrically couples an input port of the third IC to an output port of the fourth IC; and the second conductive path electrically couples an output port of the third IC to an input port of the fourth IC. The first IC, the second IC, the third IC, and the fourth IC are connected in a full mesh topology using only two trace routing layers of the printed circuit board. The external layer can include at least four ICs.

In general, another aspect of the subject matter described in this specification can be embodied in a printed circuit board that includes an external layer that includes multiple integrated circuit (IC) installation regions that are each configured to receive an IC; a first trace routing layer including a first conductive trace that is routed along a first path from a first IC installation region to a second IC installation region; a second trace routing layer including a second conductive trace that is routed along a second path from the first IC installation region to the second IC installation region, wherein the first path crosses the second path at a point between the first IC installation region and the second IC installation region; a first via region including one or more first vias that extend from the first trace routing layer to the second trace routing layer, the first via region being within a first perimeter defined by a first portion of the first path, a first portion of the second path, the point at which the first path crosses the second path, and a first point at which the first conductive trace and the second conductive trace converge to within a threshold distance of each other; and a second via region including one or more second vias that extend from the first trace routing layer to the second trace routing layer, the second via region being within a second perimeter defined by a second portion of the first path, a second portion of the second path, the point at which the first path crosses the second path, and a second point at which the first conductive trace and the second conductive trace converge to within a threshold distance of each other.

These and other implementations can each optionally include one or more of the following features. In some aspects, each first via electrically couples a respective third conductive trace on the first trace routing layer to a respective fourth conductive trace on the second trace routing layer. The respective third conductive trace, the respective fourth conductive trace, and the first via provide a first conductive path between a third IC installation region and a fourth IC installation region.

In some aspects, each second via electrically couples a respective fifth conductive trace on the first trace routing layer to a respective sixth conductive trace on the second trace routing layer. The respective fifth conductive trace, the respective sixth conductive trace, and the second via provide a second conductive path between the third IC installation region and the fourth IC installation region.

In some aspects, the first IC installation region is located in a first corner of a rectangular area; the second IC installation region is located in a second corner of the rectangular area opposite the first corner; the third IC installation region is located in a third corner of the rectangular area different from the first and second corners; and the fourth IC installation region is located in a fourth corner of the rectangular area opposite the third corner.

Some aspects include a first IC installed at the first IC installation region, a second IC installed at the second IC installation region, a third IC installed at the third IC installation region, and a fourth IC installed at the fourth IC installation region. The first conductive trace electrically couples an input port of the first IC to an output port of the second IC; the second conductive trace electrically couples an output port of the first IC to an input port of the second IC; the first conductive path electrically couples an input port of the third IC to an output port of the fourth IC; and the second conductive path electrically couples an output port of the third IC to an input port of the fourth IC.

In some aspects, the first IC, the second IC, the third IC, and the fourth IC are connected in a full mesh topology using only two trace routing layers of the printed circuit board. In some aspects, the external layer includes at least four ICs.

The subject matter described in this specification can be implemented in particular embodiments so as to realize one or more of the following advantages. Using trace routing topologies described herein, the number of routing layers of a PCB can be reduced. Reducing the number of routing layers allows for simpler PCB designs and reduced costs for fabricating the PCBs. Reducing the number of routing layers for routing traces between ICs in a mesh topology also reduces the required depth of the deepest blind vias that connect the pins of the ICs to the routing layers for the ICs, allowing for depth-limited vias such as laser blind vias.

Various features and advantages of the foregoing subject matter is described below with respect to the figures. Additional features and advantages are apparent from the subject matter described herein and the claims.

BRIEF DESCRIPTION OF THE DRAWINGS

Like reference numbers and designations in the various drawings indicate like elements.

DETAILED DESCRIPTION

In general, systems and techniques described herein relate to trace routing topologies that reduce the number of routing layers required to electrically couple components, such as ICs, installed on a PCB. When multiple ICs (or other appropriate electronic components) are to be connected in a full mesh topology or partial mesh topology, some of the conductive traces will typically have to cross one another to make all of the connections. This is typically the case for four or more IC's. As the conductive traces cannot contact each other, the traces have to cross on different routing layers of the PCB. The conductive traces, which can be copper traces, are also referred to herein as traces for brevity.

Figure 3:
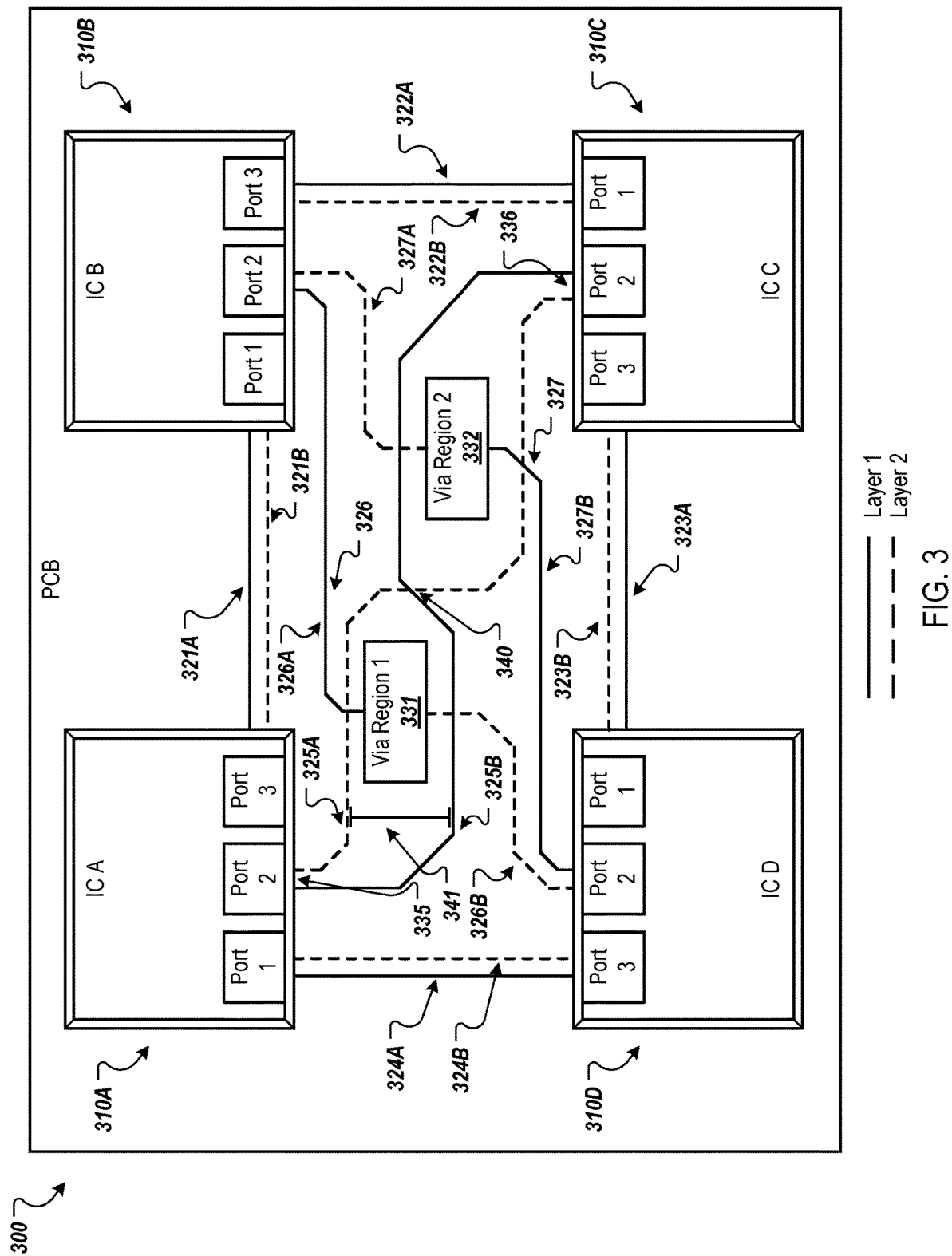
FIG. 3 is a diagram of a PCB with four ICs and a trace routing topology that uses two routing layers.

An example trace routing topology described below enables four ICs to be connected in a full mesh topology (or a partial mesh topology) using only two routing layers. Two traces that are routed between two of the ICs, IC A and IC C, can define two via regions in which the traces between the other two ICs, IC B and IC D, are transitioned between the two routing layers. For example, a first trace between IC A and IC C can be routed on a first trace routing layer. A second conductive trace between IC A and IC C can be routed on a second trace routing layer different from the first trace routing layer. The first and second traces can cross each other at a point, e.g., located between the IC A and IC C as the traces are on different trace routing layers. The crossing defines the two via regions. That is, each via region is within a perimeter defined by respective portions of the first and second traces, the crossing point, and a portion of one of the two ICs (or a point where the first and second traces converge as described below). As shown in FIG. 3 and described below, the vias in the via regions enable the traces between IC B and IC D to cross the traces between IC A and IC C on different trace routing layers such that only two trace routing layers are required to connect the four ICs.

Although the example trace routing topologies are described in terms of connecting ICs, the topologies can also be used to connect other devices, such as network switches, PCIe switches, interconnect buses, or a backplane/cable connector and IC.

Figure 1:
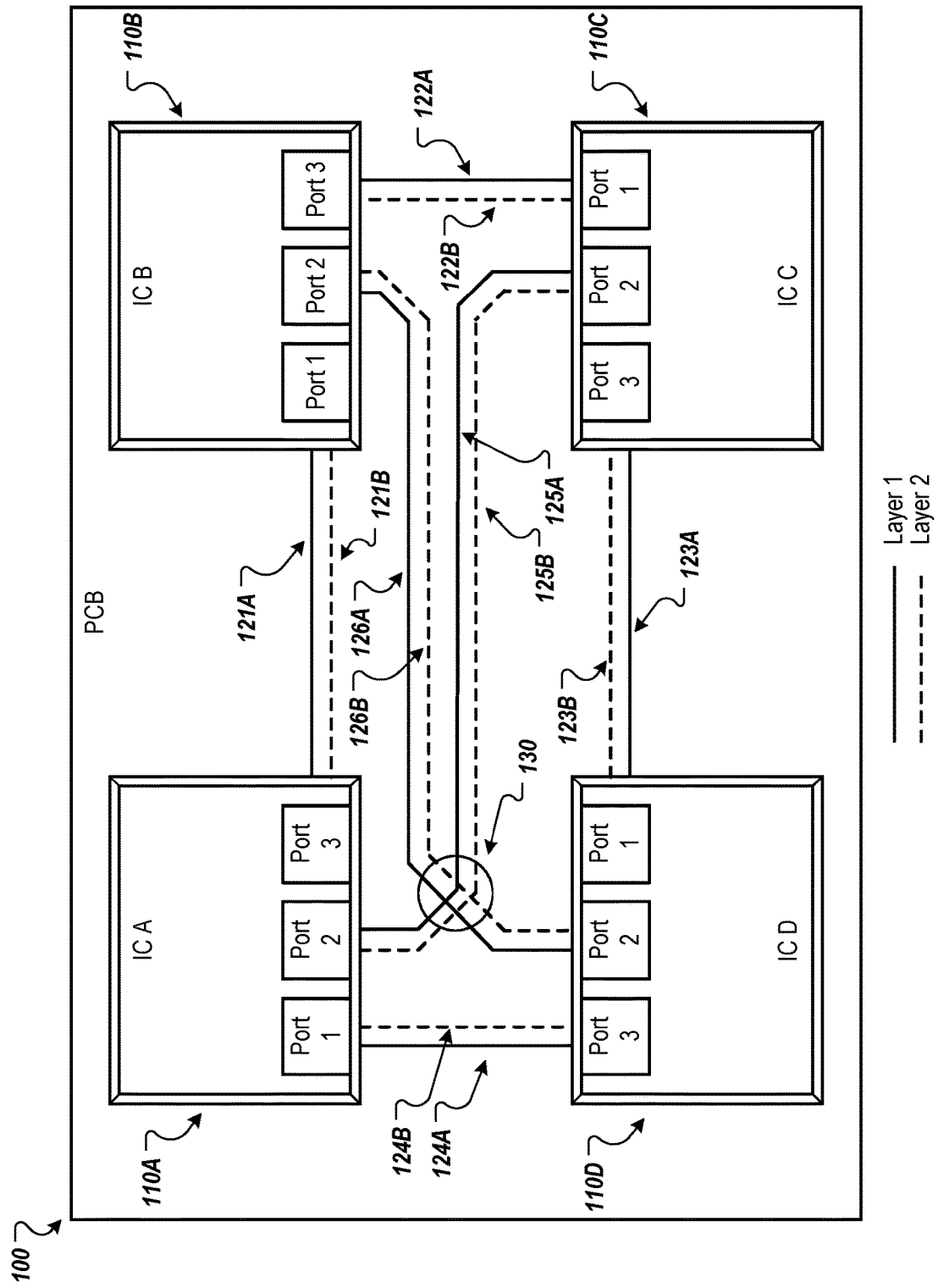
FIG. 1 is a diagram of a PCB with four ICs and an invalid trace routing topology.

FIG. 1 is a diagram of a PCB 100 with four ICs 110A-110D and an invalid trace routing topology. The ICs 110A-110D are installed on, e.g., soldered to, an external surface of the PCB 100. The PCB 100 also includes multiple internal layers that can be used to route conductive traces, e.g., copper traces. The traces that are routed on a first trace routing layer, layer 1, are shown using solid lines. The traces that are routed on a second trace routing layer, layer 2, are shown using dashed lines. The traces electrically connect components installed on the PCB 100 to one another.

The ICs 110A-110D are connected in a full mesh topology as each IC 110A-110D is connected to each other IC 110A-110D using the traces. Each IC 110A-110D includes a data communication port for each other IC 110C-110D. The ICs 110A-110D can also include other data communication ports, e.g., to communicate with other ICs or other components, e.g., to connectors that connect to components not installed on the PCB 100.

Port 1 of the IC 110A is connected to port 3 of IC 110D using traces 124A and 124B. For example, the trace 124A can connect an input of port 1 of IC 110A to an output of port 3 of IC 110D. Similarly, the trace 124B can connect an output of port 1 of IC 110A to an input of port 3 of IC 110D. This provides bidirectional communication between the ICs 110A and 110D. Each trace 124A and 124B can represent multiple traces. For example, each port can include multiple inputs and multiple outputs. A respective trace can be used to connect each input of port 1 of IC 110A to a corresponding output of port 3 of IC 110D. Similarly, a respective trace can be used to connect each output of port 1 of IC 110A to a corresponding input of port 3 of IC 110D.

In general, the trace(s) connecting the input(s) of port 1 of IC 110A to the output(s) of port 3 of IC 110D should be routed on a different layer than the trace(s) connecting the output(s) of IC 110A to the input(s) of IC 110D to reduce crosstalk between the different directional traces. In this example, trace 124A is routed on layer 1 and trace 124B is routed on layer 2. In a similar arrangement, port 3 of IC 110A is connected to port 1 of IC 110B using traces 121A and 121B routed on layers 1 and 2, respectively; port 3 of IC 110B is connected to port 1 of IC 110C using traces 122A and 122B routed on layers 1 and 2, respectively; and port 3 of IC 110C is connected to port 1 of IC 110D using traces 123A and 123B routed on layers 1 and 2, respectively.

Traces 125A and 125B connect port 2 of IC 110A to port 2 of IC 110C. Similarly, traces 126A and 126B connect port 2 of IC 110B to port 2 of IC 110D. However, as shown by the circle 130, if the traces 125A, 125B, 126A, and 126B are routed along their illustrated paths using only two routing layers, the traces 125A and 125B would cross on the same routing layer, layer 1, which is invalid. Similarly, the traces 126A and 126B would also cross on the same routing layer, layer 2, which is invalid.

Figure 2:
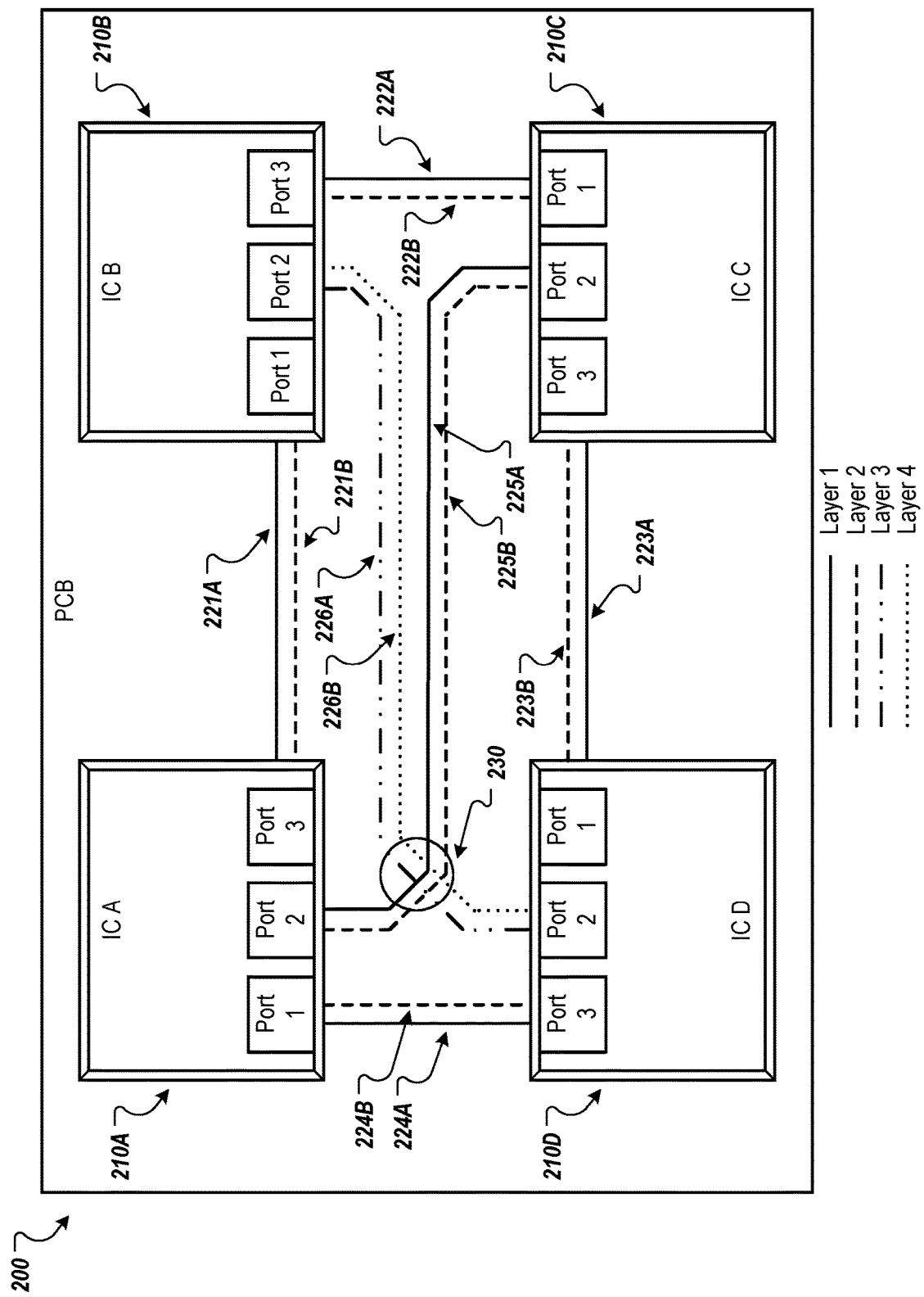
FIG. 2 is a diagram of a PCB with four ICs and a trace routing topology that uses four routing layers.

One way to allow the traces 125A and 126A to cross and to allow the traces 125B and 126B to cross is to use additional routing layers. FIG. 2 is a diagram of a PCB 200 with four ICs 210A-210D and a trace routing topology that uses four routing layers, layers 1-4.

Similar to the trace routing topology of FIG. 1, port 1 of IC 210A is connected to port 3 of IC 210D using traces 224A and 224B routed on layers 1 and 2, respectively; port 3 of IC 210A is connected to port 1 of IC 210B using traces 221A and 221B routed on layers 1 and 2, respectively; port 3 of IC 210B is connected to port 1 of IC 210C using traces 222A and 222B routed on layers 1 and 2, respectively; and port 3 of IC 210C is connected to port 1 of IC 210D using traces 223A and 223B routed on layers 1 and 2, respectively.

In addition, traces 225A and 225B connect port 2 of IC 210A to port 2 of IC 210C. Similarly, traces 226A and 226B connect port 2 of IC 210B to port 2 of IC 210D. However, in this example, the traces 225A and 225B are routed on layers 1 and 2, respectively, while the traces 226A and 226B are routed on layers 3 and 4 respectively. As shown at the circle 230, the traces 225A and 225B can cross the traces 226A and 226B since they are all on different trace routing layers. However, this trace routing topology uses four trace routing layers rather than two trace routing layers.

Figure 4:
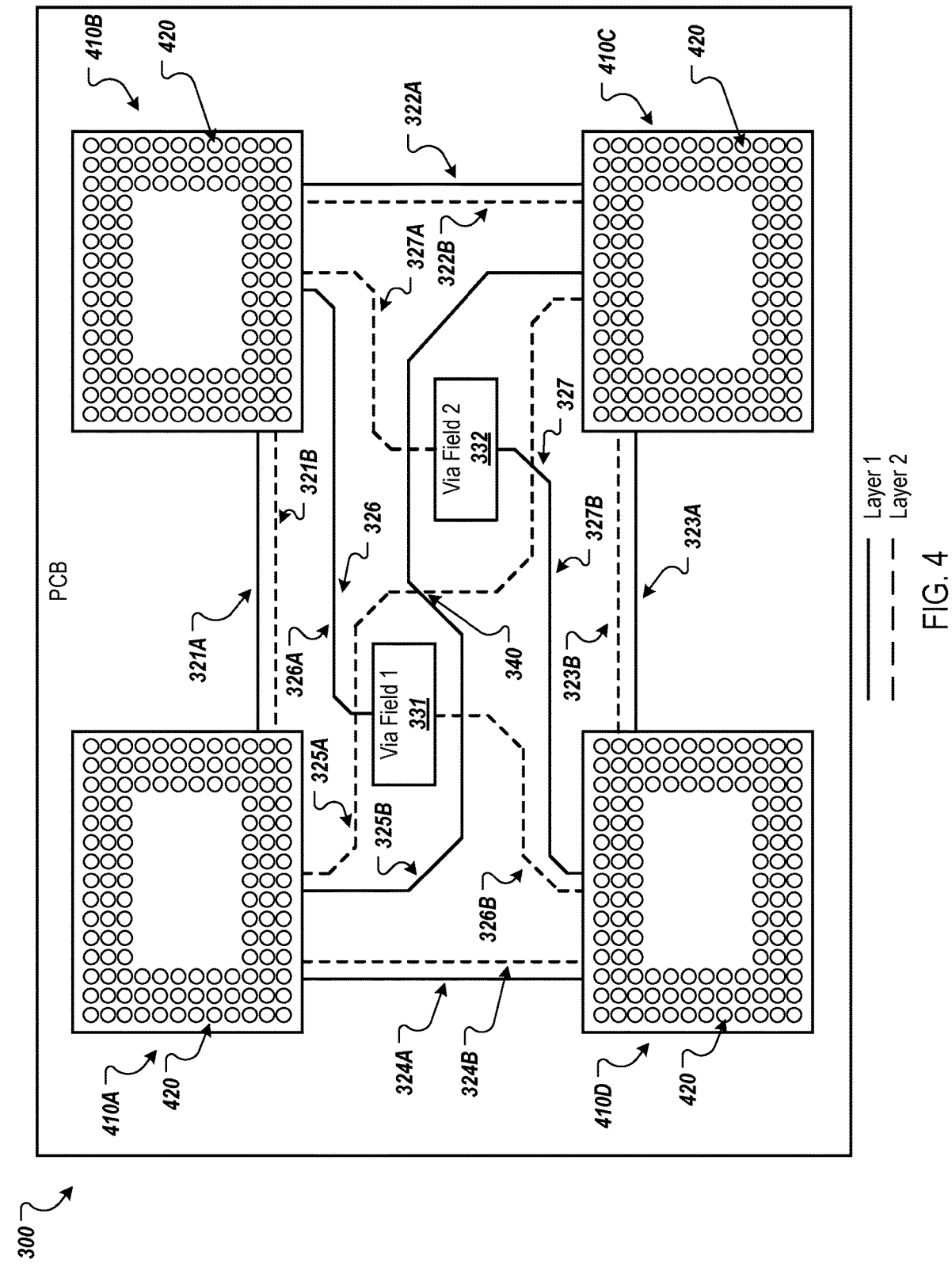
FIG. 4 is a diagram of the PCB of FIG. 3 without the ICs.

FIG. 3 is a diagram of a PCB 300 with four ICs 310A-310D and a trace routing topology that uses two routing layers. The ICs 310A-310D are installed on, e.g., electro-mechanically attached to via soldering, an external surface of the PCB 300. As shown in FIG. 4 and described below, each IC 310A-310D can be connected to the PCB 300 at a corresponding IC installation region.

The PCB 300 also includes multiple internal layers that can be used to route conductive traces, e.g., copper traces. The traces that are routed on a first trace routing layer, layer 1, are shown using solid lines. The traces that are routed on a second trace routing layer, layer 2, are shown using dashed lines. Layer 1 can be disposed between the external surface of the PCB 300 and layer 2. In another example, layer 2 can be disposed between the external surface and layer 1. The layers can be separated by dielectric material. The PCB 300 can include additional trace routing layers, e.g., a total of four trace routing layers, ten trace routing layers, or another appropriate number of trace routing layers.

The traces connect to pins of the IC using vias. A via is a hole in a multi-layer PCB for passing signals from one layer to another. A blind via connects an outer layer of the PCB to an inner layer of the PCB, and is exposed on one side of the PCB.

The ICs 310A-310D are connected in a full mesh topology as each IC 310A-310D is electrically connected to each other IC 310A-310D using the traces. Each IC 310A-310D includes a data communication port for each other IC 310C-310D. The ICs 310A-310D can also include other data communication ports, e.g., to communicate with other ICs or other components, e.g., to connectors that connect to components not installed on the PCB 300. In some implementations, the ICs 310-310D are microprocessors.

Each port can include one or more inputs and one or more outputs. One or more input ports of an IC 310A-310D can be connected to one or more output ports of another IC 310-310D using traces. Each input and each output of each port can be connected to a respective via. This via connects the input or output to a trace on one of the trace routing layers. This trace connects the via to another via that connects to the input or output of the corresponding port of a different IC.

As described above, the trace(s) connecting the input(s) of an input port of a first IC to an output port of a second IC should be routed on a different layer than the trace(s) connecting the output(s) of the first IC to the input(s) of the second IC to reduce crosstalk between the different directional traces. The trace routing topology of FIG. 3 enables this type of connection between multiple ICs (e.g., four or more ICs) using only two trace routing layers and without undue long traces around the outside of the ICs.

Port 1 of the IC 310A is connected to port 3 of IC 310D using traces 324A and 324B. For example, the trace 324A can connect an input of port 1 of IC 310A to an output of port 3 of IC 310D. Similarly, the trace 324B can connect an output of port 1 of IC 310A to an input of port 3 of IC 310D. This provides bidirectional communication between the port 1 of IC 310A and port 3 of IC 310D. Each trace 324A and 324B can represent multiple traces as each port can include multiple inputs and multiple outputs. The multiple traces can be routed in parallel with some space between each pair of traces to reduce or prevent crosstalk between the traces. A respective trace can be used to connect each input of port 1 of IC 310A to a corresponding output of port 3 of IC 310D. Similarly, a respective trace can be used to connect each output of port 1 of IC 310A to a corresponding input of port 3 of IC 310D.

In this example, trace 324A is routed on layer 1 and trace 324B is routed on layer 2. In a similar arrangement, port 3 of IC 310A is connected to port 1 of IC 310B using traces 321A and 321B routed on layers 1 and 2, respectively; port 3 of IC 310B is connected to port 1 of IC 310C using traces 322A and 322B routed on layers 1 and 2, respectively; and port 3 of IC 310C is connected to port 1 of IC 310D using traces 323A and 323B routed on layers 1 and 2, respectively. Similar to the traces 324A and 324B between IC 310A and IC 310D, each of these pairs of traces can provide bidirectional communication between their respective ICs. In addition, each of these traces can represent multiple traces, e.g., if the ports have multiple inputs and outputs, as described above.

Traces 325A and 325B connect port 2 of IC 310A to port 2 of IC 310C. The trace 325A is routed along a first path on layer 1 and the trace 325B is routed on a second path on layer 2. Each trace 325A and 325B can represent multiple traces that are routed along a same path, e.g., in parallel and spaced apart to reduce or prevent crosstalk between pairs of traces. The traces 325A and 325B are routed along respective paths that are spaced apart in some areas and that cross at a crossing point 340. That is, one of the traces 325A or 325B passes over the other trace 325A or 325B at point 340 depending on which trace is on the upper layer and which trace is on the lower layer as between the two layers.

This crossing of the traces 325A and 325B define two via regions 331 and 332 where the traces 325A and 325B are spaced apart from each other. Although the via regions 331 and 332 are shown using rectangular boxes, the via regions 331 and 332 can be anywhere in the spaces formed between the traces 325A and 325B. For example, the via region 331 can have, or be located within, a perimeter that is defined by a portion 335 of the IC 310A between the traces 325A and 325B (or a point at which the traces 325A and 325B converge near the IC 310A and are within a threshold distance of each other), a portion of the trace 325A between the crossing point 340 and the IC 310A, a portion of the trace 325B between the crossing point 340 and the IC 310A, and the crossing point 340 itself. In another example, the via region 331 is a defined region within this perimeter, e.g., within a defined area having a round, rectangular, or other appropriate geometric shape.

Similarly, the via region 332 can have, or be located within, a perimeter that is defined by a portion 336 of the IC 310C between the traces 325A and 325B (or a point at which the traces 325A and 325B converge near the IC 310C and are within a threshold distance of each other), a portion of the trace 325A between the crossing point 340 and the IC 310C, a portion of the trace 325B between the crossing point 340 and the IC 310C, and the crossing point 340 itself. In another example, the via region 332 is a defined region within this perimeter, e.g., within a defined area having a round, rectangular, or other appropriate geometric shape.

The traces 325A and 325B can be spaced apart on either side of the crossing point 340 to form the via regions 331 and 332. For example, the traces 325A and 325B can be spaced apart at least a threshold distance (e.g., a threshold lateral distance along a plane parallel with the trace routing layers) for at least a threshold length of their respective paths to form the via regions 331 and 332. For example, the distance 341 between the traces 325A and 325B can be at least a threshold distance for at least a threshold horizontal length of the traces 325A and 325B above and below the via region 331. The size of the regions, and thus the threshold distances, can be selected based on the number of vias in each via region 331 and 332.

Although the traces 325A and 325B are shown having approximately 45 degree angled turns, the traces 325A and 325B can have other shapes and paths while still forming the via regions 331 and 332. For example, the traces 325A and 325B can follow paths that include approximately 90 degree turns instead of approximately 45 degree turns. In this example, the traces 325A and 325B can form an x-shape at or near the center of the area between the ICs 310A-310D. In another example, the turns of the traces 325A and 325B can be round. In this example, each trace 325A and 325B can be s-shaped.

A trace 326 that includes a first portion 326A and a second portion 326B connects port 2 of the IC 310B to port 2 of the IC 310D. The via region 331 transitions the trace 326 between layer 1 and layer 2 of the PCB 300 so that the trace 326 can cross the traces 325A and 325B on different layers than the traces 325A and 325B. In particular, the first portion 326A is routed along layer 1 of the PCB 300 between port 2 of the IC 310B (e.g., between a via that connects to port 2 of the IC 310B) and a via in the via region 331. This first portion 326A crosses the trace 325A, which is routed on layer 2 of the PCB 300. The via connects the first portion 326A to the second portion 326B. The second portion 326B is routed along layer 2 of the PCB 300 between the via and port 2 of the IC 310D (e.g., a via that connects to port 2 of the IC 310D). The second portion 326B crosses the trace 325B, which is routed on layer 1 of the PCB 300. Thus, routing the trace 326 on the two layers of the PCB 300 in this way allows the trace 326 to cross the traces 325A and 325B using only two routing layers.

The trace 326 can represent multiple traces that are routed along this path (e.g., in parallel with separation) between the IC 310B and the IC 310D. The via region 331 can include a respective via for each individual trace represented by the trace 327.

Similar to the trace 326, a trace 327 that includes a first portion 327A and a second portion 327B connects port 2 of the IC 310B to port 2 of the IC 310D. For example, the trace 326 can connect an input of port 2 of the IC 310B to an output of port 2 of the IC 310D and the trace 327 can connect an input of port 2 of the IC 310D to an output of port 2 of the IC 310B.

The via region 332 transitions the trace 327 between layer 1 and layer 2 of the PCB 300 so that the trace 327 can cross the traces 325A and 325B on different layers than the traces 325A and 325B. In particular, the first portion 327A is routed along layer 2 of the PCB 300 between port 2 of the IC 310B (e.g., between a via that connects to port 2 of the IC 310B) and a via in the via region 332. This first portion 327A crosses the trace 325B, which is routed on layer 1 of the PCB 300. The via connects the first portion 327A to the second portion 327B. The second portion 327B is routed along layer 1 of the PCB 300 between the via and port 2 of the IC 310D (e.g., a via that connects to port 2 of the IC 310D). The second portion 327B crosses the trace 325A, which is routed on layer 2 of the PCB 300. Thus, routing the trace 327 on these two layers of the PCB 300 in this way allows the trace 327 to cross the traces 325A and 325B using only two routing layers.

The trace 327 can represent multiple traces that are routed along this path (e.g., in parallel with separation) between the IC 310B and the IC 310D. The via region 332 can include a respective via for each individual trace represented by the trace 327.

In this example, the ICs 310A-310D are arranged within a square shape, with each IC 310A-310D being in a corner of the square. This square shaped arrangement includes two rows of two ICs each. The crossing point 340 is located near the center of the area between the ICs 310A-310D, with a via region 331 and 332 on either side of the crossing point 340.

Other shapes and arrangements are also possible using the same or a similar trace routing topology. For example, the ICs 310A-310D do not have to be in rows and columns. That is, the IC 310C can be to the right of the IC 310B or the IC 310D can be below the IC 310C.

In another example, the via regions 331 and 332 can be side by side rather than the offset arrangement of FIG. 3. For example, the traces 325A and 325B can form a shape similar to the number eight around the via regions 331 and 332.

The ICs 310A-310D can also be connected in a partial mesh topology rather than a full mesh topology. For example, the IC A may not be connected to the IC B. In this example, the traces 321A and 321B would not be included.

The PCB 300 can include more than four ICs. For example, the ICs 310B and 310C can be connected to ICs located to the right of the ICs 310B and 310C. The ICs 310-310D can be connected to other ICs of the PCB 300 using a partial mesh topology where some of the ICs 310-310D are connected to some of the other ICs.

FIG. 4 is a diagram of the PCB 300 of FIG. 3 without the ICs 310A-310D. The PCB 300 includes, for each IC 310A-310D, an IC installation region 410A-410D, respectively. For example, the PCB 300 can be fabricated with the internal routing layers, layer 1 and layer 2, and an external layer that includes the IC installation regions 410A-410D. The ICs 310A-310D can later be installed in their IC installation regions 410A-410D.

In this example, each IC installation region 410A-410D includes an arrangement of conductive pads. Each conductive pad 420 can include a conductive material to which a conductive pad of an IC can be coupled. For example, the ICs 310A-310D can include a ball grid array (BGA) with conductive pads that are soldered to the conductive pads 420 of the corresponding IC installation region 410A-410D. In another example, each IC installation region can include holes with conductive perimeters for receiving and being soldered to pins of the ICs 310A-310D.

The traces of the PCB 300 can be routed between the conductive pads of the IC installation regions 410A-410D. For example, the trace 321A can be connected to a via under the IC installation region 410A. This via can be a blind via that extends from the external layer of the PCB 300 to layer 1 of the PCB 300 where the trace 321A is routed. This via can connect the trace 321A to a conductive pad on the external surface of the PCB 300 that will receive a conductive pad of port 3 of the IC 310A. In another example, the trace 323B can be connected to a via under the IC installation region 410D. This via can be a blind via that extends from the external layer of the PCB 300 to from layer 2 of the PCB 300 where the trace 323B is routed. This via can connect the trace 323B to a conductive pad on the external surface of the PCB 300 that will receive a conductive pad of port 1 of the IC 310D. Each other trace that connects to an IC 310A-310D can be similarly connected to a conductive pad for the IC 310A-310D using a via.

Figure 5:
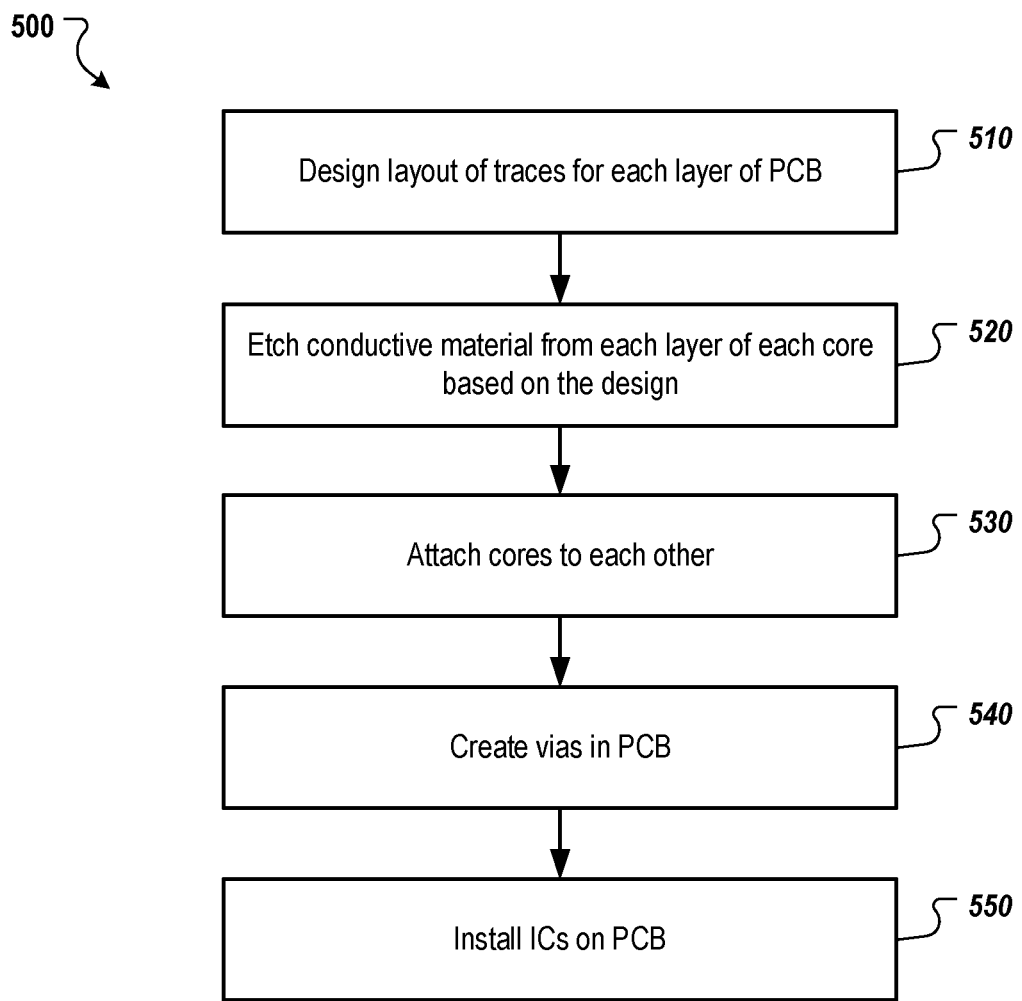
FIG. 5 is a flow diagram that illustrates an example process for fabricating a PCB.

FIG. 5 is a flow diagram that illustrates an example process 500 for fabricating a PCB. The process 500 can be performed by a system that includes one or more data processing apparatus and fabrication equipment.

The system designs a layout of traces for each layer of a PCB (510). The system can layout the traces based on a circuit diagram that specifies connections between the ICs (and/or other components) of the PCB. In another example, a person, such as a PCB designer, can layout the traces of the PCB.

If the PCB will include four or more ICs in a full mesh topology, or otherwise requires two or more traces to cross two or more other traces, the system can generate a routing topology that allows the traces to be routed on two trace routing layers. For example, the system can route two traces that are to connect a first pair of ICs such that the two traces are on different routing layers and cross at some point between the first pair of ICs. The system can also locate vias in via regions defined by the two traces, as described above with reference to FIG. 3.

The system can route traces between a second pair of ICs such that the traces do not contact the traces routed between the first pair of ICs. For example, the system can route these traces such that each trace transitions between the two layers in one of the via regions and such that, when the trace crosses a trace between the first pair of ICs, the traces are on different routing layers.

The system etches conductive material from each layer of each core based on the design (520). Each routing layer can be on a surface of a core that includes a layer of dielectric material that has a copper foil attached to both sides. The system can etch away the copper from the side of a core that will be used as a trace routing layer based on the layout of the traces on that layer. For example, the system can etch away the copper to form conductive traces based on the layout of the traces in the design.

The system attaches the cores to each other (530). The system can attach the cores to each other using a prepreg material. The prepreg material can be an adhesive dielectric material that holds the cores together.

The system creates vias in the PCB based on the design (540). For example, the fabrication equipment can create the vias in each via region based on the design by drilling the vias and putting a conductive material, e.g., copper, in the via. The system can create similar vias under IC installation regions to connect conductive pads for the ICs to the traces of the trace routing layers.

ICs are installed on the PCB (550). For example, each IC can be placed on a corresponding IC installation region. Each conducive pad or pin of the IC can be soldered to a corresponding pad or hole of the IC installation region.

The term "data processing apparatus" encompasses all kinds of apparatus, devices, and machines for processing data, including by way of example a programmable processor, a computer, a system on a chip, or multiple ones, or combinations, of the foregoing. The apparatus can include special purpose logic circuitry, e.g., an FPGA (field programmable gate array) or an ASIC (application specific integrated circuit).

The processes and logic flows described in this specification can be performed by one or more programmable processors executing one or more computer programs to perform actions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing actions in accordance with instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

The invention claimed is:

1. A printed circuit board comprising:
    an external layer that includes multiple integrated circuit (IC) installation regions that are each configured to receive an IC;
    a first trace routing layer comprising a first conductive trace that is routed along a first path from a first IC installation region to a second IC installation region;
    a second trace routing layer comprising a second conductive trace that is routed along a second path from the first IC installation region to the second IC installation region, wherein the first conductive trace crosses over or under the second conductive trace at a point between the first IC installation region and the second IC installation region;
    a first via region comprising one or more first vias that extend from the first trace routing layer to the second trace routing layer, the first via region being within a first perimeter that includes (i) a first portion of the first conductive trace that extends from a first starting point at the first IC installation region to the point at which the first conductive trace crosses over or under the second conductive trace and (ii) a first portion of the second conductive trace that extends from the point at which the first conductive trace crosses over or under the second conductive trace to a first end point at the first IC installation region; and
    a second via region comprising one or more second vias that extend from the first trace routing layer to the second trace routing layer, the second via region being within a second perimeter that includes (i) a second portion of the first conductive trace that extends from a second starting point at the second IC installation region to the point at which the first conductive trace crosses over or under the second conductive trace and (ii) a second portion of the second conductive trace that extends from the point at which the first conductive trace crosses over or under the second conductive trace to a second end point at the second IC installation region.

2. The printed circuit board of claim 1, wherein each first via electrically couples a respective third conductive trace on the first trace routing layer to a respective fourth conductive trace on the second trace routing layer, wherein the respective third conductive trace, the respective fourth conductive trace, and the first via provides a first conductive path between a third IC installation region and a fourth IC installation region.

3. The printed circuit board of claim 1, wherein each second via electrically couples a respective fifth conductive trace on the first trace routing layer to a respective sixth conductive trace on the second trace routing layer, wherein the respective fifth conductive trace, the respective sixth conductive trace, and the second via provides a second conductive path between a third IC installation region and a fourth IC installation region.

4. The printed circuit board of claim 1, wherein the first perimeter further includes a portion of a perimeter of the first IC installation region that extends from the first starting point at the first IC installation region to the first end point at the first IC installation region.

5. The printed circuit board of claim 4, wherein the perimeter of the first IC installation region comprises a rectangular shape having four sides and wherein the portion of the perimeter of the first IC installation region comprises a portion of one side of the first IC installation region between the first starting point and the first end point.

6. The printed circuit board of claim 1, wherein the second perimeter further includes a portion of a perimeter of the second IC installation region that extends from the second starting point at the second IC installation region to the second end point at the second IC installation region.

7. The printed circuit board of claim 6, wherein the perimeter of the second IC installation region comprises a rectangular shape having four sides and wherein the portion of the perimeter of the second IC installation region comprises a portion of one side of the second IC installation region between the second starting point and the second end point.

8. A printed circuit board comprising:
an external layer that includes multiple integrated circuit ICs installed thereon;
a first trace routing layer comprising a first conductive trace that is routed along a first path from a first IC to a second IC;
a second trace routing layer comprising a second conductive trace that is routed along a second path from the first IC to the second IC, wherein the first conductive trace crosses over or under the second conductive trace at a point between the first IC and the second IC;
a first via region comprising one or more first vias that extend from the first trace routing layer to the second trace routing layer, the first via region being within a first perimeter that includes (i) a first portion of the first conductive trace that extends from a first starting point at the first IC to the point at which the first conductive trace crosses over or under the second conductive trace and (ii) a first portion of the second conductive trace that extends from the point at which the first conductive trace crosses over or under the second conductive trace to a first end point at the first IC; and
a second via region comprising one or more second vias that extend from the first trace routing layer to the second trace routing layer, the second via region being within a second perimeter that includes (i) a second portion of the first conductive trace that extends from a second starting point at the second IC to the point at which the first conductive trace crosses over or under the second conductive trace and (ii) a second portion of the second conductive trace that extends from the point at which the first conductive trace crosses over or under the second conductive trace to a second end point at the second IC.

9. The printed circuit board of claim 8, wherein each first via electrically couples a respective third conductive trace on the first trace routing layer to a respective fourth conductive trace on the second trace routing layer, wherein the respective third conductive trace, the respective fourth conductive trace, and the first via provides a first conductive path between a third IC and a fourth IC.

10. The printed circuit board of claim 8, wherein each second via electrically couples a respective fifth conductive trace on the first trace routing layer to a respective sixth conductive trace on the second trace routing layer, wherein the respective fifth conductive trace, the respective sixth conductive trace, and the second via provides a second conductive path between a third IC and a fourth IC.

11. The printed circuit board of claim 8, wherein the first perimeter further includes a portion of a perimeter of the first IC that extends from the first starting point at the first IC to the first end point at the first IC.

12. The printed circuit board of claim 11, wherein the perimeter of the first IC comprises a rectangular shape having four sides and wherein the portion of the perimeter of the first IC comprises a portion of one side of the first IC between the first starting point and the first end point.

13. The printed circuit board of claim 8, wherein the second perimeter further includes a portion of a perimeter of the second IC that extends from the second starting point at the second IC to the second end point at the second IC.

14. The printed circuit board of claim 13, wherein the perimeter of the second IC comprises a rectangular shape having four sides and wherein the portion of the perimeter of the second IC comprises a portion of one side of the second IC between the second starting point and the second end point.

15. A board comprising:
a first layer that includes multiple integrated circuit (IC) installation regions that are each configured to receive an IC;
a second layer comprising a first conductive trace that is routed along a first path from a first IC installation region to a second IC installation region;
a third layer comprising a second conductive trace that is routed along a second path from the first IC installation region to the second IC installation region, wherein the first conductive trace crosses over or under the second conductive trace at a point between the first IC installation region and the second IC installation region;
a first via region comprising one or more first vias that extend from the second layer to the third layer, the first via region being within a first perimeter that includes (i) a first portion of the first conductive trace that extends from a first starting point at the first IC installation region to the point at which the first conductive trace crosses over or under the second conductive trace and (ii) a first portion of the second conductive trace that extends from the point at which the first conductive trace crosses over or under the second conductive trace to a first end point at the first IC installation region; and
a second via region comprising one or more second vias that extend from the second layer to the third layer, the second via region being within a second perimeter that includes (i) a second portion of the first conductive trace that extends from a second starting point at the second IC installation region to the point at which the first conductive trace crosses over or under the second conductive trace and (ii) a second portion of the second conductive trace that extends from the point at which the first conductive trace crosses over or under the second conductive trace to a second end point at the second IC installation region.

16. The board of claim 15, wherein each first via electrically couples a respective third conductive trace on the second layer to a respective fourth conductive trace on the third layer, wherein the respective third conductive trace, the respective fourth conductive trace, and the first via provides a first conductive path between a third IC installation region and a fourth IC installation region.

17. The board of claim 15, wherein each second via electrically couples a respective fifth conductive trace on the second layer to a respective sixth conductive trace on the third layer, wherein the respective fifth conductive trace, the respective sixth conductive trace, and the second via provides a second conductive path between a third IC installation region and a fourth IC installation region.

18. The board of claim 15, wherein the first perimeter further includes a portion of a perimeter of the first IC installation region that extends from the first starting point at the first IC installation region to the first end point at the first IC installation region.

19. The board of claim 18, wherein the perimeter of the first IC installation region comprises a rectangular shape having four sides and wherein the portion of the perimeter of the first IC installation region comprises a portion of one side of the first IC installation region between the first starting point and the first end point.

20. The board of claim 15, wherein the second perimeter further includes a portion of a perimeter of the second IC installation region that extends from the second starting point at the second IC installation region to the second end point at the second IC installation region.

* * * * *